United States Patent
Sreeram et al.

(10) Patent No.: US 6,653,741 B2
(45) Date of Patent: Nov. 25, 2003

(54) THERMAL INTERFACE MATERIAL AND HEAT SINK CONFIGURATION

(75) Inventors: Attiganal N. Sreeram, Princeton, NJ (US); Brian Lewis, Branford, CT (US); Leszek Hozer, Plainsboro, NJ (US); Michael James Liberatore, Trenton, NJ (US); Gerard Minogue, Kinnelon, NJ (US)

(73) Assignee: Fry's Metals, Inc., Jersey City, NJ (US)

( * ) Notice: Subject to any disclaimer, the term of this patent is extended or adjusted under 35 U.S.C. 154(b) by 0 days.

(21) Appl. No.: 10/151,741

(22) Filed: May 20, 2002

(65) Prior Publication Data

US 2002/0175403 A1 Nov. 28, 2002

Related U.S. Application Data

(60) Provisional application No. 60/293,457, filed on May 24, 2001, and provisional application No. 60/306,218, filed on Jul. 18, 2001.

(51) Int. Cl.⁷ .......... H01L 23/48; H01L 23/52; H01L 29/40
(52) U.S. Cl. .......... 257/781; 257/779; 257/783; 257/782; 257/784
(58) Field of Search .......... 257/781, 779, 257/783, 782, 784

(56) References Cited

U.S. PATENT DOCUMENTS

| | | | |
|---|---|---|---|
| 3,996,548 A | | 12/1976 | Chaffin |
| 4,670,770 A | * | 6/1987 | Tai .......... 257/777 |
| 4,819,857 A | * | 4/1989 | Mizuishi et al. .......... 228/121 |
| 4,954,870 A | * | 9/1990 | Takemura et al. .......... 257/673 |
| 5,023,697 A | * | 6/1991 | Tsumura .......... 257/780 |
| 5,082,162 A | | 1/1992 | Kamiyama et al. |
| 5,097,387 A | | 3/1992 | Griffith |
| 5,240,172 A | | 8/1993 | Steinke et al. |

(List continued on next page.)

FOREIGN PATENT DOCUMENTS

| | | | |
|---|---|---|---|
| EP | 1 153 698 A1 | 11/2001 | |
| JP | 62-212095 A | 9/1987 | |
| JP | 62-263895 | * 11/1987 | |
| JP | 9-172224 | * 6/1997 | .......... H01L/23/373 |
| JP | 11-26335 | * 1/1999 | .......... H01L/23/373 |
| NL | 9200564 A | 10/1993 | |
| WO | WO 99/02299 | 1/1999 | |
| WO | WO 01/34860 | 5/2001 | |

OTHER PUBLICATIONS

Hareesh Mavoori et al., Universal Solders for Direct and Powerful Bonding on Semiconductors, Diamond, and Optical Materials, Applied Physics Letter, May 7, 2001, pp. 2976–2978 vol. 78, No. 19.

International Search Report, PCT/US02/15870, dated Apr. 10, 2003, 4 pages.

*Primary Examiner*—Jasmine Clark
(74) *Attorney, Agent, or Firm*—Senniger, Powers, Leavitt & Roedel

(57) ABSTRACT

A thermal interface material for use in electronic packaging, the thermal interface material comprises a solder with relatively high heat flow characteristics and a CTE modifying component to reduce or prevent damage due to thermal cycling. The thermal interface material comprises an active solder that contains indium and an intrinsic oxygen getter selected from the group consisting of alkali metals, alkaline-earth metals, refractory metals, rare earth metals and zinc and mixtures and alloys thereof. Lastly, damage due to an electronic package due to thermal cycling stress is reduced by using an insert in a lid of an electronic device package wherein the insert has a coefficient of thermal expansion that is between about that of the lid and about that of a semiconductor substrate.

44 Claims, 1 Drawing Sheet

U.S. PATENT DOCUMENTS

| | | |
|---|---|---|
| 5,242,658 A | 9/1993 | Stevens et al. |
| 5,256,370 A | 10/1993 | Slattery et al. |
| 5,306,950 A * | 4/1994 | Fujikawa et al. ............ 257/750 |
| 5,471,092 A * | 11/1995 | Chan et al. .................. 257/753 |
| 5,552,234 A * | 9/1996 | Kawasumi .................. 428/633 |
| 5,635,764 A * | 6/1997 | Fujikawa et al. ............ 257/766 |
| 5,755,896 A | 5/1998 | Paruchuri et al. |
| 5,938,862 A | 8/1999 | Yeh et al. |
| 6,047,876 A | 4/2000 | Smith |
| 6,059,900 A * | 5/2000 | Gayle et al. ................. 148/400 |
| 6,176,947 B1 | 1/2001 | Hwang et al. |
| 6,205,264 B1 | 3/2001 | Jin et al. |
| 6,231,693 B1 | 5/2001 | Lugscheider et al. |
| 6,306,516 B1 | 10/2001 | Jin et al. |
| 6,319,617 B1 | 11/2001 | Jin et al. |
| 6,326,685 B1 | 12/2001 | Jin et al. |
| 6,365,973 B1 | 4/2002 | Koning |

* cited by examiner

THERMAL INTERFACE MATERIAL AND HEAT SINK CONFIGURATION

CROSS-REFERENCE TO RELATED APPLICATIONS

This application claims the benefit of U.S. Provisional Application No. 60/293,457, filed May 24, 2001 and U.S. Provisional Application No. 60/306,218, filed Jul. 18, 2001.

BACKGROUND OF THE INVENTION

Thermal interface materials (TIMs) are critical to protect active semiconductor devices, such as microprocessors, from exceeding the operational temperature limit. They enable bonding of the heat generating device (e.g., a silicon semiconductor) to a heat sink or a heat spreader (e.g, copper and/or aluminum components) without creating an excessive thermal barrier. The TIM may also be used in the assembly of other components of the heat sink or the heat spreader stack that comprise the overall thermal impedance path.

Formation of a small thermal barrier is an important property of a TIM. The thermal barrier can be described in terms of effective thermal conductivity through the TIM and is preferably as high as possible. The effective thermal conductivity of the TIM is primarily due to the interfacial heat transfer coefficient as well as the (intrinsic) bulk thermal conductivity of the TIM. A variety of other properties are also important for a TIM depending on the particular application, for example: an ability to relax thermal expansion stresses when joining two materials (also referred to as "compliance"), an ability to form a mechanically sound joint that is stable during thermal cycling, a lack of sensitivity to moisture and temperature changes, manufacturing feasibility, and cost.

Several classes of materials are being currently used as TIMs, for example, thermal greases, thermal gels, adhesives, elastomers, thermal pads, and phase change materials. Although the foregoing TIMs are adequate for many current semiconductor devices, the increased performance of semiconductor devices in the near future will render the presently known TIMs inadequate. Specifically, the thermal conductivity of current TIMs generally does not exceed about 5 W/mK and is typically less than about 1 W/mK. However, TIMs that form thermal interfaces with effective thermal conductivities of about 15 W/mK or greater will soon be needed.

One alternative to the foregoing TIMs is a solid metal sheet or preform made of indium or other low melting temperature alloys that act as the thermal interface layer. The metal TIMs ensure high thermal conductivity value (e.g., about 80 W/mK for an indium sheet). Metal TIMs may also exhibit a favorable solder or wetting behavior upon reflow which facilitates a low thermal interfacial resistance. During reflow, the solder and substrate are heated, the solder melts and wets by surface tension and/or local surface alloying. The interfaces consist of intermetallics or interdiffused metals with thermal properties that are frequently less desirable than those of the bulk TIM metal but much better than existing (polymer based) TIMs. In most cases, metallic TIMs have to be subjected to reflow in order to form reliable thermal interfaces. Metallic TIMs, however, can fail in certain applications due to the relatively large difference(s) between the coefficients of thermal expansion (CTEs) of the TIM and the semiconductor and/or heat sink components and the lack of compliance.

SUMMARY OF THE INVENTION

The present invention is directed to materials, processes and designs to improve the performance of a semiconductor to heat sink interface thereby increasing the flow of heat from an electronic (heat generating) device. Among the objects and features of the present invention, therefore, is the provision of a TIM which has a high thermal conductivity (e.g., greater than about 15 W/mK); the provision of a TIM which has a high interfacial heat transfer coefficient (i.e., greater than about 50 W/cm$^2$° C.); the provision of a TIM with a coefficient of thermal expansion (CTE) that is a compromise between semiconductor devices and heat sink components so that the TIM will resist separation from the semiconductor substrate or the heat sink components or resist damaging the semiconductor substrate; the provision of a TIM with improved resistance to thermal cycling induced stress failure; the provision of a TIM with improved resistance to moisture changes; the provision of a TIM with improved resistance to temperature changes; the provision of a TIM which bonds to a heat sink component and a semiconductor device at a temperature less than the failure temperature of an active (electronic) device; the provision of a TIM which enables bonding to a semiconductor substrate and a heat sink component without the use of a flux (i.e., the TIM preferably comprises a fluxless or active solder); and the provision of a TIM which is readily compatible with active semiconductor device manufacturing processes. In short, the provision of a TIM in which the bulk properties and the interface properties are optimal for heat transfer and reliability.

Briefly, therefore, the present invention is directed to a thermal interface material comprising a solder and a CTE modifying component.

The present invention is also directed to an active solder that wets at a temperature below about 300° C. without extrinsic fluxing, the active solder comprises indium and an intrinsic oxygen getter selected from the group consisting of alkali metals, alkaline-earth metals, refractory metals, rare earth metals and zinc and mixtures and alloys thereof.

Further, the present invention is directed to an active solder that wets at a temperature below about 300° C. without extrinsic fluxing, the solder comprises about 80% by weight gold, and about 20% by weight tin and an intrinsic oxygen getter selected from the group consisting of alkali metals, alkaline-earth metals, refractory metals, rare earth metals and zinc and mixtures and alloys thereof.

Additionally, the present invention is directed to an electronic device package comprising: a semiconductor substrate having a front surface and a back surface; an electronic device on the front surface of the semiconductor substrate; a heat sink component having a front surface and a back surface; and a thermal interface material bonding the back surface of the semiconductor substrate to the front surface of the heat sink component, the thermal interface material comprising a solder and a CTE modifying component that has a coefficient of thermal expansion that is less than about 10 $\mu$m/m° C.

The present invention is also directed to an electronic device package comprising: a semiconductor substrate having a front surface and a back surface; an electronic device on the front surface of the semiconductor substrate; a lid having a front surface and a back surface and a recess for receiving an insert; the insert being sized and shaped to fit within the recess in the lid, the insert having a front surface, a back surface, a surface in contact with the lid and a coefficient of thermal expansion that is between about that of the lid and about that of the semiconductor substrate; and a first thermal interface material bonding the back surface of the semiconductor substrate to at least a portion of the front surface of the insert.

DETAILED DESCRIPTION OF THE INVENTION

Figure 1:
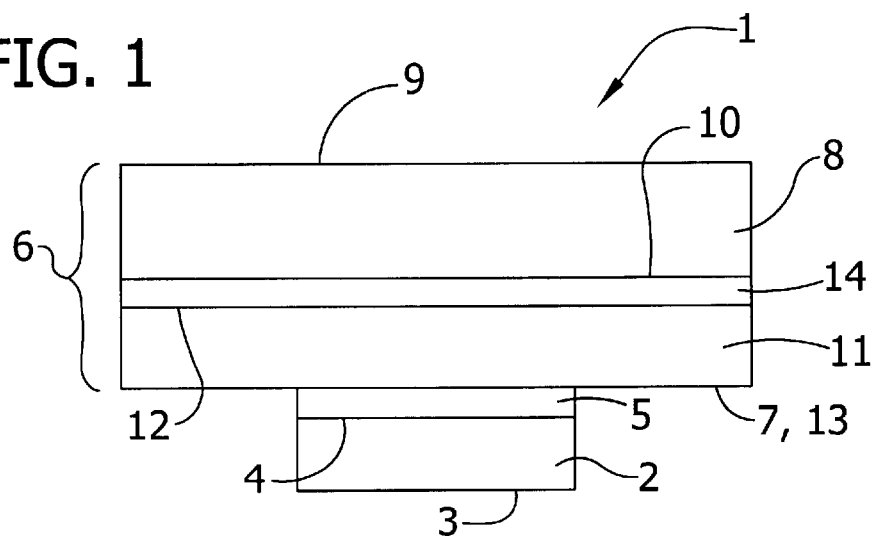
FIG. 1 is a cross-sectional view of a conventional semiconductor device/heat sink configuration.

Improvements in electronic device performance are frequently accompanied by increased power consumption and decreased device size, which independently or cooperatively may result in increased power densities. Therefore, the flow of heat from the operating electronic device must be increased to keep the device below its operational temperature limit. The present invention is directed to high performance TIM materials and processes which increase the flow of heat from an electronic device and designs which improve the semiconductor to heat sink interface.

I. High Performance Thermal Interface Material

A. High Effective Bulk Thermal Conductivity

The high performance TIM comprises a solder that allows the TIM to bond to a substrate. As used herein, the term "substrate" refers to a semiconductor and/or a heat sink component and/or any other article, device, apparatus, etc. which is joined to another such "substrate" with the TIM. When thermally processed, the TIM should bond to the substrate at a temperature less than the failure temperature of an active (electronic) device (e.g., below about 350° C., preferably below about 250° C. and more preferably below about 200° C.). The solder melts below the active device failure temperature, wets to the substrate and allows the formation of a chemical and/or mechanical bond between the TIM and the substrate when solidified. In general, the solder melts at a temperature less than about 300° C., preferably less than about 225° C., more preferably less than about 170° C., and still more preferably between about 160° C. and about 115° C.

The solder may comprise a conventional soldering material which requires an adjustment of the CTE (see infra). For example, the solder may comprise lead, bismuth, tin, gold, silver, gold-tin, gold-silicon, gold-germanium, etc. Preferably, the solder comprises a bonding component with a low melting temperature and a relatively high thermal conductivity compared to conventional TIM materials (less than about 5 W/mK). For example, indium (melting point is about 155° C., thermal conductivity is about 80 W/mK), tin (melting point is about 230° C., thermal conductivity is about 70 W/mK) and mixtures and alloys thereof. In a particularly preferred embodiment, the bonding component consists essentially of indium because of its low melting temperature and its ability to readily wet many oxides, ceramics, and cermets without the use of organic fluxing agents (see infra).

To further increase the heat flow through the TIM, the TIM may also comprise a thermal conductivity enhancement component. The thermal conductivity enhancement component preferably has a thermal conductivity above about 100 W/mK. Exemplary thermal conductivity enhancement component materials include silver, copper and gold which have thermal conductivities of about 425 W/mK, about 400 W/mK and about 315 W/mK, respectively. Such metals typically have relatively high melting temperatures (e.g., the melting point of silver is about 960° C., copper is about 1,085° C. and gold is about 1,065° C.).

B. Interfacial Heat Transfer Coefficient

In addition to increasing the heat flow through the TIM by selecting highly conductive materials (i.e., reducing the intrinsic thermal resistance of the TIM), a significant improvement in the heat flow from the source to substrate is realized by increasing the heat transfer coefficient at the interface. In fact, the resistance to heat flow at such an interface can be up to about two orders of magnitude greater than the resistance of the TIM. The primary cause of a low interfacial heat transfer coefficient is often the formation of areas at the interface in which the substrate and the TIM are not in intimate contact. Thus, those areas act as insulation and reduce the heat flow away from the heat source. A secondary cause of reduced heat transfer through the interface is the presence of various intermetallic phases exhibiting higher thermal resistance. Preferably, the interfacial heat transfer coefficient of the TIM is greater than about 50 $W/cm^{2\circ}$ C. and more preferably greater than about 500 $W/cm^{2\circ}$ C.

Typically, a TIM used to join a semiconductor (or a metalized semiconductor) and a heat sink requires mechanical and/or chemical fluxing to remove oxygen from the surfaces of the TIM, the semiconductor substrate and the heat sink component to activate the joining process and allow the TIM to wet the surfaces. Chemical fluxing is typically used when attempting to join items with conventional solders at temperatures below about 300° C. A typical chemical flux comprises compounds which upon being heated become active and remove surface oxides. However, some of the flux materials do not escape and form insulating pockets or voids at the interfacial region and/or form residues that may be harmful for the operation of the device.

1. Active Solders

In accordance with the present invention, the TIM (including the solder) preferably does not require extrinsic fluxing (i.e., mechanical fluxing and organic and inorganic fluxing compounds are not needed). Rather, the solder in the TIM of the present invention is preferably activated by an intrinsic oxygen getter that is mixed or alloyed with the bonding component. The intrinsic oxygen getter is more reactive with oxygen than the bonding component thereby preventing or minimizing the formation of bonding component-oxygen compounds. Exemplary intrinsic oxygen getters include alkali metals (e.g., Li, Na, and K), alkaline-earth metals (e.g., Mg and Ca), zinc, refractory metals (e.g., Ti, Zr, Hf, Ta, V, and Nb), rare earth metals (e.g., La, Ce, Pr, Nd, Sm, Eu, Gd, Tb, Dy and Yb), and mixtures and alloys thereof (e.g. misch metal which is available, for example, from Alfa Aesar of Ward Hill, Mass., USA at a composition that comprises about 50% by weight Ce, about 22% La, about 18% Nd, about 6% Pr and about 0–4% of Yb, Sm, Gd, Eu, Tb and Dy). Preferably, the total concentration of refractory metals in the solder is less than about 10% by weight, the total concentration of rare earth metals is less than about 5% by weight, and the total concentration of alkali, alkaline-earth and zinc is less than about 20% by weight.

The selection of the materials and their relative amounts for incorporation in the solder and the thermal conductivity enhancement component will depend upon the nature of materials joined, the necessary effective thermal conductivity and the maximum bonding temperature for the particular application. Additionally, the selection of materials may depend on other factors including material cost, ease of recycle, as well as overall influence on important solder properties such as hardness, modulus of elasticity, ductility, intermetallic phase formation, corrosion resistance, coefficient of thermal expansion, influence on creep resistance and oxide formation.

In a preferred embodiment, the active solder comprises indium, titanium and misch metal to provide a compliant yet high CTE alloy that is substantially molten above about 157° C. Preferably, it comprises about 0.5 to about 2% by weight Ti and about 0.1 to about 2.0% by weight misch metal with remainder being In. More preferably, it comprises about 1% by weight Ti, and about 0.2% by weight misch metal with the remainder being In. Such a compliant TIM soldered with a very low level of interfacial defects is less likely to fail at the interface as a result of thermal cycling (see infra).

In yet another preferred embodiment, the active solder is a rigid gold-based solder with a relatively low CTE (about 13–14 $\mu$m/m° C.) that is typically used to attach sub-mounts or secure fiber optics (e.g., gold-tin, gold-silicon and gold-germanium solders). Typically, for gold-tin alloys the concentrations of gold and tin range from about 75 to about 85% by weight and from about 15 to about 25% by weight, respectively. For gold-silicon alloys the concentration of gold is at least about 90% and the concentration of silicon ranges from about 1 to about 5% by weight. For gold-germanium alloys the concentration of gold is at least about 80% and the concentration of germanium ranges from about 5 to about 15% by weight. To provide relatively low melting or reflow temperatures the solder compositions are preferably near the eutectic composition (e.g., the constituents are within about ±3% by weight of the eutectic composition). The eutectic compositions are about 80Au-20Sn, about 97Au-3Si and about 88Au-12Ge. The near eutectic gold-tin alloy is particularly preferred for many applications because it is molten above about 280° C. Because these gold-based solders contain significantly less oxidizable material, less intrinsic oxygen getter materials are needed. Specifically, the concentration of intrinsic oxygen getter materials is preferably about half that of the indium based solder. Preferably the total concentration of refractory metals in the solder is less than about 5% by weight, the total concentration of rare earth metals is less than about 3% by weight, and the total concentration of alkali, alkaline-earth and zinc is less than about 10% by weight. More preferably, the total concentration of refractory metals is about 0.5 to about 1.5% by weight, the total concentration of rare-earth metals is about 0.01 to about 0.5% by weight, the total concentration of alkali metals is about 0.1 to about 0.5% by weight, the total concentration of alkaline-earth metals is about 0.1 to about 0.5% by weight, and the total concentration of zinc is about 0.1 to about 0.5% by weight. These lower CTE alloys are also less likely to fail than non-compliant high-CTE alloys at a semiconductor/solder interface as a result of thermal cycling (see infra).

In addition to eliminating the need for extrinsic fluxing, the active solder and the thermal interface material comprising the active solder are able to wet non-metallic surfaces such as, but not limited to, Si, SiO2, SiN, and II–IV and III–V semiconductor. As a result, wettable metallizations such as, but not limited to, Au, Au/Ni, Ni, Cu, Sn and combinations thereof are not required to be deposited on such non-metallic surfaces before a soldering/bonding operation. This ability to bond to nonmetallic surface provides a significant materials and process benefits.

The TIM and active solder of the present invention are particularly suited for thermal processing at temperatures below about 300° C. and preferably below about 200° C. However, the TIM and active solder of the present invention may be thermal processed at elevated temperatures (e.g., greater than about 500° C.) to provide more effective wetting (e.g., shorter wetting time).

In addition to improving solder processes where the heat flow across the interface is critical, the foregoing active solders are particularly useful in the manufacture of opto-electronic packages. Specifically, active opto-electronic packages comprise lasing devices. If the beam intercepts any organic residue from a chemical flux, the laser readily carbonizes the residue which can disable the device. The use of a fluxless soldering process eliminates this potential failure mechanism.

The active solder may be formed by any available inert melting method such as melting by induction in an inert crucible or by arc melting. The system is evacuated and back filled with a non-reactive inert gas such as argon. The metals are heated preferably above about 1000° C. to ensure adequate dissolution of the alloy constituents. The molten alloy is cast or formed and during cooling the submicron intermetallic precipitates typically form. Frequently, the cooled alloy is mechanically worked into a wire, a tape or a preform for use in the production of the TIM.

2. CTE Mismatch

Another method for maintaining enhanced heat flow through the TIM is to prevent degradation in the intimate contact at the interfacial region over the life of the electronic device. Specifically, the differences between the coefficients of thermal expansion for the various components in an electronic package create stress during thermal cycling which can lead to partial or complete separation at the interfacial region. This problem is particularly acute for TIMs comprising materials with high coefficients of thermal expansion compared to typical semiconductor materials such as silicon, germanium, gallium arsenide, cadmium sulfide and indium antimonide and light emitting diode material including solid state emitters for photonic and fiber optic laser applications (e.g., In/As/GaAs and InAs/Al/Sb). Typically, the bonding component materials and thermal conductivity enhancement component materials have CTEs that are greater than about 16 $\mu$m/m° C. and the substrate material has a CTE less than about 10 $\mu$m/m° C.

The TIM of the present invention minimizes the negative impact of the CTE mismatch by preferably comprising a CTE modifying component. The CTE modifying component has a CTE that is more compatible with the substrate thereby decreasing the thermal stress upon thermal cycling. The CTE modifying component has a CTE that is preferably less than about 10 $\mu$m/m° C. and more preferably less than about 8 $\mu$m/m° C. Exemplary CTE modifying component materials include beryllium oxide (about 8.8 $\mu$m/m° C.), aluminum oxide (about 6.5–7.0 $\mu$m/m° C.), aluminum nitride (about 4.2 um/m° C.), silicon carbide (about 4.0 $\mu$m/m° C.), silicon dioxide (about 0.5 $\mu$m/m° C.), copper-tungsten alloys (about 5.6 $\mu$m/m° C.), low expansion iron-nickel alloys commonly referred to as KOVAR or INVAR (about 5.2 $\mu$m/m° C. to about 6.0 $\mu$m/m° C.), low expansion ceramic or glass powders (about −1.0 $\mu$m/m° C. to about 9.0 $\mu$m/m° C.) and mixtures thereof. In a preferred embodiment of the present invention the CTE modifying component comprises low expansion iron-nickel alloys because they have a low or negative CTE, are readily wetted by and incorporated into the solder alloy, have a relatively high thermal conductivity, and have a relatively high ductility which makes them amenable to post-alloying processing (e.g., rolling and extrusion). Preferably, the CTE mismatch between the TIM and the substrate is between about 5 $\mu$m/m° C. and about 30 $\mu$m/m° C. More preferably, the CTE mismatch between the TIM and the substrate is between about 5 μm/m° C. and about 20 μm/m° C. Still more preferably, the CTE mismatch between the TIM and the substrate is less than about 10 μm/m° C. Most preferably, the TIM is tailored for the desired CTE mismatch for the particular application.

Although the amount of solder and CTE modifying component depends on the particular application, the TIM preferably comprises about 30% to about 90% by volume of solder and about 10% to about 70% by volume of CTE modifying component. More preferably, the TIM comprises about 50% to about 90% by volume of the solder and about 10% to about 50% by volume of the CTE modifying component.

C. TIM Manufacturing Process—Optimizing CTE

The high performance TIM of the present invention may be manufactured and applied to the substrate by any applicable method. For example, the particles of the CTE modifying component may be incorporated into the solder and/or thermal conductivity enhancement component to form a composite TIM. The composite TIM is typically then rolled into a thin sheet preform (e.g., less than 0.25 mm thick). To form the thermal interface, the TIM preform is heated, and while molten, contacted with a substrate and allowed to cool, solidify and bond. Another method is the use of a foil or a mesh of desired thickness comprising a bonding component and/or a thermal conductivity enhancement component in which openings are formed (e.g., by punching or etching) and the openings are filled with the CTE modifying component. For example, an indium-based foil with hexagonally spaced openings may be filled with beryllium oxide. In the case of a copper foil or mesh, the copper is coated with a bonding component such as indium (e.g., by dipping or plating). A suitable diffusion barrier component (e.g., nickel, titanium or other transitional metals) may be required to prevent rapid dissolution of copper into the indium during the melting/bonding process. An additional method is the use of a sponge comprising a bonding component and/or a thermal conductivity enhancement component (e.g., 90% theoretical density) filled with the CTE modifying component. If necessary, the sponge may be cut into thin sheets to achieve the desired thickness.

Typically, the CTE modifying component particles are "pre-wet" with a solder to ensure bonding with the bonding component during reflow. Specifically, the CTE modifying component particles are coated with a thin layer of the solder by any appropriate method such as plating, thermal spraying, vacuum deposition or reduction processing.

II. CTE Mismatch Resistant Semiconductor Substrate/Heat Sink Interface

The present invention is also directed to an improved interface for connecting the semiconductor substrate and heat sink components, the improved interface reduces or eliminates the negative impact of the CTE mismatch between a TIM and the substrates. Thus, the improved interface increases the critical range of the CTE mismatch.

Referring now to FIG. 1, the typical semiconductor/heat sink configuration of an electronic device package 1 comprises a semiconductor substrate 2 having a front surface 3 and a back surface 4, an electronic device (not pictured) being located on the front surface, a first thermal interface material 5 which bonds the back surface 4 of the semiconductor substrate 2 to a heat sink component 6 having a front surface 7, the heat sink component comprises a heat exchanger 8 having a back surface 9 and a front surface 10, and optionally, a lid 11 having a back surface 12 and a front surface 13. If the optional lid 11 is included, a second thermal interface material 14 bonds the back surface of the lid 12 to the front surface 10 of the heat exchanger 8. In accordance with the present invention, the above-described high performance thermal interface material may be used to compensate for the CTE mismatch between the substrate and the lid and between the lid and the heat exchanger in such a typical electronic device package.

Figure 2:
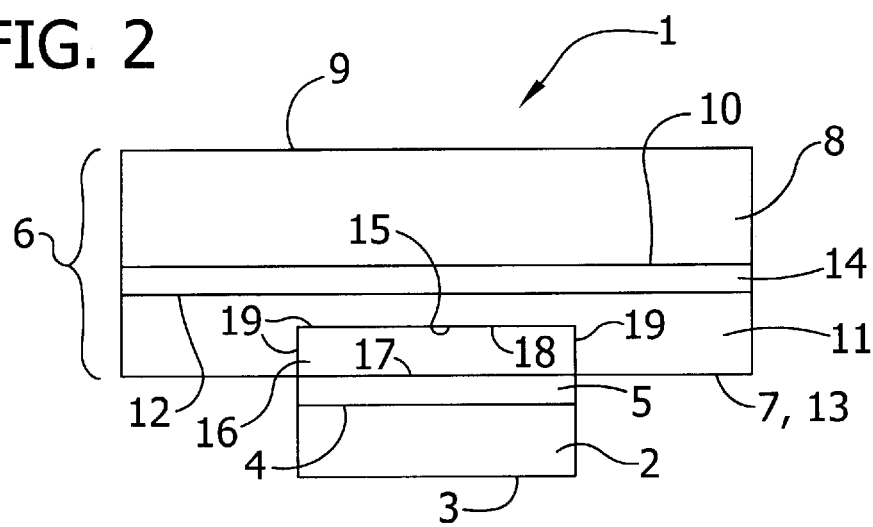
FIG. 2 is a cross-sectional view of an embodiment of the semiconductor device/heat sink configuration of the present invention.

Referring now to FIG. 2, the present invention is directed to an electronic device package 1 comprising a semiconductor substrate 2 having a front surface and a back surface, and an electronic device (not pictured) on the front surface of the semiconductor substrate. The package also comprises a lid 11 which comprises a recess 15 for receiving an insert 16 which is sized and shaped to fit within the recess. In this embodiment, the recess extends inward from the front surface of the lid to a point between the front surface and the back surface of the lid. The insert comprises a front surface 17, a back surface 18, and a surface in contact with the lid 19. The electronic device package further comprises a first thermal interface material 5 which bonds the back surface of the substrate 2 to the front surface 17 of the insert 16. Preferably, the package also comprises a second thermal interface material 14 which bonds the back surface 12 of the lid 11 to the heat exchanger 8. The insert comprises a thermal stress relieving material that has a CTE that more closely matches the CTE of the substrate than does the CTE of the lid (see supra). Stated another way, the CTE of the insert is between the CTE of the lid and the CTE of the substrate. Therefore, the first thermal interface material need only accommodate the relatively small CTE mismatch between the insert and the substrate rather than the larger CTE mismatch between the substrate and the lid. As a result, the greatest CTE mismatch is typically between the insert/lid interface and because the CTE of the insert is typically smaller than that of the lid, the insert can be compression mounted within the lid.

Figure 3:
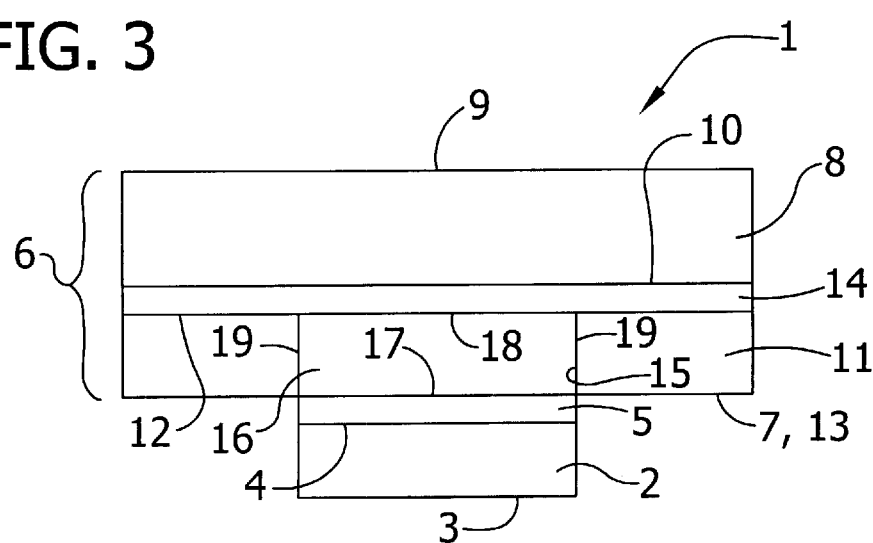
FIG. 3 is a cross-sectional view of an embodiment of the semiconductor device/heat sink configuration of the present invention.

Referring now to FIG. 3, the recess 15 may extend through the lid 11 (i.e., the recess extends from the front surface to the back surface of the lid) and likewise the insert 16 may extend completely through the lid 11. As a result, the second thermal interface material 14 also bonds the insert 16 to the heat exchanger 8.

In view of the above, it will be seen that the several objects of the invention are achieved. As various changes could be made in the above compositions and processes without departing from the scope of the invention, it is intended that all matter contained in the above description be interpreted as illustrative and not in a limiting sense.

What is claimed is:

1. A thermal interface material for bonding substrates, the thermal interface material is characterized by a reflow temperature that is less than about 350° C., by a thermal conductivity of at least about 15 W/mK, and by consisting essentially of:
   a. a solder having a melting temperature that is less than about 300° C. and consisting essentially of:
      i. a bonding component selected from the group consisting of indium, an indium-tin alloy, a gold-tin alloy and mixtures thereof;
      ii. optionally, a thermal conductivity enhancement component having a thermal conductivity that is at least about 100 W/mK; and
      iii. an intrinsic oxygen getter selected from the group consisting of rare earth metals, alkali metals, alkaline-earth metals, refractory metals, zinc, and mixtures and alloys thereof; and
   b. a CTE modifying component having a coefficient of thermal expansion that is less than about 10 μm/m° C.

2. The thermal interface material as set forth in claim 1 having a reflow temperature that is less than about 250° C. and a thermal conductivity of at least about 20 W/mK.

3. The thermal interface material as set forth in claim 1 having a reflow temperature that is less than about 200° C. and a thermal conductivity of at least about 30 W/mK.

4. The thermal interface material as set forth in claim 1 wherein the bonding component is indium.

5. The thermal interface material as set forth in claim 1 wherein the CTE modifying component is selected from the group consisting of beryllium oxide, aluminum oxide, aluminum nitride, silicon carbide, silicon dioxide, copper-tungsten alloys, low expansion iron-nickel alloys, low expansion ceramic powders, low expansion glass powders and mixtures thereof.

6. The thermal interface material as set forth in claim 1 wherein the solder is about 30% to about 90% by volume of the thermal interface material and the CTE modifying component is about 10% to about 70% by volume of the thermal interface material.

7. The thermal interface material asset forth in claim 1 wherein the solder is about 50% to about 90% by volume of the thermal interface material and the CTE modifying component is about 10% to about 50% by volume of the thermal interface material.

8. The thermal interface material as set forth in claim 1 wherein the thermal conductivity enhancement component is selected from the group consisting of silver, copper, gold and mixtures and alloys thereof.

9. The thermal interface material as set forth in claim 1 wherein the alkali metals are selected from the group consisting of lithium, sodium and potassium and mixtures and alloys thereof, the alkaline earth metals are selected from the group consisting of magnesium and calcium and mixtures and alloys thereof, the refractory metals are selected from the group consisting of titanium, zirconium, hafnium, tantalum, vanadium and niobium and mixtures and alloys thereof, the rare earth metals are selected from the group consisting of lanthanum, cerium, praseodymium, samarium, neodymium, europium, gadolinium, terbium, dysprosium and ytterbium and mixtures and alloys thereof.

10. The thermal interface material as set forth in claim 1 wherein bonding component is indium or the indium-tin alloy and the total concentration of refractory metals in the solder is less about 10% by weight, the total concentration of rare earth metals in the solder is less about 5% by weight, and the total concentration of alkali metals, alkaline-earth metals and zinc is less than about 20% by weight.

11. The thermal interface material as set forth in claim 1 wherein bonding component is the gold-tin alloy and the total concentration of refractory metals in the solder is less than about 5% by weight, the total concentration of refractory metals is less than about 3% by weight, and the total concentration of alkali metals, alkaline-earth metals and zinc is less than about 10% by weight.

12. A thermal interface material for bonding electronic device package substrates, the thermal interface material comprising a solder that comprises gold, a second metal selected from the group consisting of tin, silicon, germanium and mixtures and alloys thereof and an intrinsic oxygen getter selected from the group consisting of rare earth metals, alkali metals, alkaline-earth metals, refractory metals, zinc, and mixtures and alloys thereof;
wherein the solder comprises about 75 to about 85% by weight gold and about 15 to about 25% by weight tin, or the solder comprises at least about 90% by weight gold and about 1 to about 5% by weight silicon, or the solder comprises at least about 80% by weight gold and about 5 to about 15% by weight germanium.

13. The thermal interface material as set forth in claim 12 wherein the total concentration of refractory metals in the solder is less than about 5% by weight, the total concentration of refractory metals is less than about 3% by weight, and the total concentration of alkali metals, alkaline-earth metals and zinc is less than about 10% by weight.

14. A thermal interface material for bonding substrates, the thermal interface material is characterized by having a reflow temperature that is less than about 350° C. and by having a thermal conductivity of at least about 15 W/mK, the thermal interface material consisting essentially of:
a solder consisting essentially of indium, about 0.5 to about 2% by weight of titanium and about 0.1 to about 2% by weight of misch metal, wherein the concentration of the solder ranges from about 30% to about 90% by volume of the thermal interface material; and
a CTE modifying component selected from the group consisting of beryllium oxide, aluminum oxide, aluminum nitride, silicon carbide, silicon dioxide, copper-tungsten alloys, low expansion iron-nickel alloys, low expansion ceramic powders, low expansion glass powders and mixtures thereof, wherein the concentration of the thermal interface material ranges from about 10% to about 70% by volume of the thermal interface material.

15. A thermal interface material for bonding substrates, the thermal interface material is characterized by having a reflow temperature that is less than about 350° C. and by having a thermal conductivity of at least about 15 W/mK, the thermal interface material consisting essentially of:
a solder consisting essentially of indium, about 1% by weight of titanium and about 0.2% by weight of misch metal, wherein the concentration of the solder ranges from about 30% to about 90% by volume of the thermal interface material; and
a CTE modifying component selected from the group consisting of beryllium oxide, aluminum oxide, aluminum nitride, silicon carbide, silicon dioxide, copper-tungsten alloys, low expansion iron-nickel alloys, low expansion ceramic powders, low expansion glass powders and mixtures thereof, wherein the concentration of the CTE modifying component ranges from about 10% to about 70% by volume of the thermal interface material.

16. An active solder that wets metallic and non-metallic surfaces at a temperature below about 300° C. without extrinsic fluxing, the active solder comprising bonding component selected from the group consisting of indium, an indium-tin alloy, and mixtures thereof, and an intrinsic oxygen getter selected from the group consisting of alkali metals, alkaline-earth metals, refractory metals, rare earth metals and zinc and mixtures and alloys thereof.

17. An active solder for bonding electronic device package substrates that wets metallic and non-metallic surfaces at a temperature below about 300° C. without extrinsic fluxing, the active solder comprising a bonding component selected from the group consisting of indium, an indium-tin alloy, a gold-tin alloy and mixtures thereof, and an intrinsic oxygen getter selected from the group consisting of alkali metals, alkaline-earth metals, refractory metals, rare earth metals and zinc and mixtures and alloys thereof;
wherein the bonding component comprises indium or the indium-tin alloy and the total concentration of the refractory metals is less than about 10% by weight, the total concentration of the rare earth metals is less than about 5% by weight, and the total concentration of the alkali metals, alkaline-earth metals and zinc is less than about 20% by weight.

18. An active solder for bonding electronic device package substrates that wets metallic and non-metallic surfaces at a temperature below about 300° C. without extrinsic fluxing, the active solder comprising a bonding component selected from the group consisting of indium, an indium-tin alloy, a gold-tin alloy and mixtures thereof, and an intrinsic oxygen getter selected from the group consisting of alkali metals, alkaline-earth metals, refractory metals, rare earth metals and zinc and mixtures and alloys thereof;
   wherein the bonding component comprises indium or the indium-tin alloy and the intrinsic oxygen getter is about 0.5 to about 2% by weight titanium and about 0.1 to about 2% by weight misch metal.

19. The active solder as set forth in claim 18 wherein the bonding component is indium or the indium-tin alloy and the intrinsic oxygen getter is about 1% by weight titanium and about 0.2% by weight misch metal.

20. An active solder for bonding electronic device package substrates that wets metallic and non-metallic surfaces at a temperature below about 300° C. without extrinsic fluxing, the active solder comprising a bonding component selected from the group consisting of indium, an indium-tin alloy, a gold-tin alloy and mixtures thereof, and an intrinsic oxygen getter selected from the group consisting of alkali metals, alkaline-earth metals, refractory metals, rare earth metals and zinc and mixtures and alloys thereof;
   wherein the bonding component comprises the gold-tin alloy and the gold-tin alloy comprises about 77 to about 83% by weight gold and about 17 to about 23% by weight tin, and the total concentration of refractory metals in the solder is about 0.5 to about 1.5% by weight, the total concentration of alkali metals is about 0.1 to about 0.5% by weight, the total concentration of alkaline-earth metals is about 0.1 to about 0.5% by weight, and the total concentration of zinc is about 0.1 to about 0.5% by weight.

21. An electronic device package comprising:
   a. a semiconductor substrate having a front surface and a back surface;
   b. an electronic device on the front surface of the semiconductor substrate;
   c. a heat sink component having a front surface and a back surface; and
   d. a thermal interface material bonding the back surface of the semiconductor substrate to the front surface of the heat sink component, the thermal interface material being characterized by a reflow temperature that is less than about 350° C. by a thermal conductivity of at least about 15 W/mK, and by consisting essentially of a solder having a melting temperature that is less than about 300° C. and a CTE modifying component having a coefficient of thermal expansion that is less than about 10 $\mu$m/m° C., wherein the solder consists essentially of:
      i. a bonding component selected from the group consisting of indium, an indium-tin alloy, a gold-tin alloy and mixtures thereof;
      ii. optionally, a thermal conductivity enhancement component having a thermal conductivity that is at least about 100 W/mK; and
      iii. an intrinsic oxygen getter selected from the group consisting of rare earth metals, alkali metals, alkaline-earth metals, refractory metals, zinc, and mixtures and alloys thereof.

22. The electronic device package as set forth in claim 21 wherein the CTE modifying component has a coefficient of thermal expansion that is less than about 8 $\mu$m/m° C.

23. The electronic device package as set forth in claim 21 wherein the thermal interface material comprises about 30% to about 90% by volume of the solder and about 10% to about 70% by volume of the CTE modifying component.

24. The electronic device package as set forth in claim 21 wherein the thermal interface material comprises about 50% to about 90% by volume of the solder and about 10% to about 50% by volume of the CTE modifying component.

25. The electronic device package as set forth in claim 21 wherein the thermal interface material is characterized by a reflow temperature below about 250° C.

26. The electronic device package as set forth in claim 21 wherein the thermal interface material is characterized by a reflow temperature below about 200° C.

27. The electronic device package as set forth in claim 21 wherein the thermal interface material is characterized by a bulk thermal conductivity of at least about 20 W/mK.

28. The electronic device package as set forth in claim 21 wherein the thermal interface material is characterized by a bulk thermal conductivity of at least about 30 W/mK.

29. The electronic device package as set forth in claim 21 wherein the electronic device package is characterized by an interfacial heat transfer coefficient between the back surface of the semiconductor substrate and the thermal interface material that is greater than about 50 W/cm$^2$° C.

30. The electronic device package as set forth in claim 21 wherein the electronic device package is characterized by an interfacial heat transfer coefficient between the back surface of the semiconductor substrate and the thermal interface material that is greater than about 500 W/cm$^2$° C.

31. The electronic device package as set forth in claim 21 wherein the CTE modifying component is selected from the group consisting of beryllium oxide, aluminum oxide, aluminum nitride, silicon carbide, silicon dioxide, copper-tungsten alloys, low expansion iron-nickel alloys, low expansion ceramic powders, low expansion glass powders and mixtures thereof.

32. The electronic device package as set forth in claim 21 wherein the thermal conductivity enhancement component is selected from the group consisting of silver, copper, gold and mixtures and alloys thereof.

33. The electronic device package as set forth in claim 21 wherein the alkali metals are selected from the group consisting of lithium, sodium and potassium and mixtures and alloys thereof, the alkaline earth metals are selected from the group consisting of magnesium and calcium and mixtures and alloys thereof, the refractory metals are selected from the group consisting of titanium, zirconium, hafnium, tantalum, vanadium and niobium and mixtures and alloys thereof, the rare earth metals are selected from the group consisting of lanthanum, cerium, praseodymium, samarium, neodymium, europium, gadolinium, terbium, dysprosium and ytterbium and mixtures and alloys thereof.

34. The electronic device package as set forth in claim 21 wherein the solder consists essentially of indium, about 0.5 to about 2% by weight of titanium and about 0.1 to about 2% by weight of misch metal.

35. The electronic device package as set forth in claim 21 wherein the solder consists essentially of indium, about 1% by weight of titanium and about 0.2% by weight of misch metal.

36. An electronic device package comprising:
   a semiconductor substrate having a front surface and a back surface;

an electronic device on the front surface of the semiconductor substrate;

a lid having a front surface and a back surface and a recess for receiving an insert;

the insert being sized and shaped to fit within the recess in the lid, the insert having a front surface, a back surface, a surface in contact with the lid and a coefficient of thermal expansion that is between about that of the lid and about that of the semiconductor substrate; and a first thermal interface material bonding the back surface of the semiconductor substrate to at least a portion of the front surface of the insert.

37. The electronic device package as set forth in claim 36 wherein the recess in the lid extends inward from the front surface of the lid to a point between the front surface and the back surface of the lid.

38. The electronic device package as set forth in claim 36 wherein the recess in the lid extends inward from the front surface of the lid to the back surface of the lid.

39. The electronic device package as set forth in claim 36 wherein the insert is compression mounted in the lid.

40. The electronic device package as set forth in claim 36 wherein the entire back surface of the semiconductor substrate is bonded to the front surface of the insert by the first thermal interface material.

41. The electronic device package as set forth in claim 36 comprising:

a heat exchanger having a front surface and back surface; and a second thermal interface material for bonding at least a portion of the front surface of the heat exchanger to the back surface of the lid.

42. The electronic device package as set forth in claim 41 wherein the second interface material bonds the back surface of the insert to the front surface of the heat exchanger.

43. The electronic device package as set forth in claim 41 wherein the semiconductor substrate comprises silicon, the lid comprises copper, the heat exchanger comprises aluminum, the insert is selected from the group consisting of beryllium oxide, aluminum oxide, aluminum nitride, silicon carbide, silicon dioxide, copper-tungsten alloys, low expansion iron-nickel alloys, low expansion ceramic powders, low expansion glass powders and mixtures thereof, and the first and second thermal interface materials comprise a solder selected from the group consisting of indium, tin, gold, bismuth, lead, silicon, germanium, copper, silver, lithium, sodium, potassium, magnesium, calcium, titanium, zirconium, hafnium, tantalum, vanadium, niobium, lanthanum, cerium, praseodymium, samarium, neodymium, europium, gadolinium, terbium, dysprosium, zinc and mixtures and alloys thereof.

44. The electronic device package as set forth in claim 43 wherein the first and second thermal interface materials comprise a CTE modifying component selected from the group consisting of beryllium oxide, aluminum oxide, aluminum nitride, silicon carbide, silicon dioxide, copper-tungsten alloys, low expansion iron-nickel alloys, low expansion ceramic powders, low expansion glass powders and mixtures thereof.

* * * * *